United States Patent [19]

Kondo

[11] Patent Number: 4,914,497

[45] Date of Patent: Apr. 3, 1990

[54] SEMICONDUCTOR INTEGRATED CIRCUIT DEVICE PROVIDED WITH A CAPACITOR ELEMENT HAVING AN OXIDATION-RESIST FILM AS A DIELECTRIC AND PROCESS FOR MANUFACTURING THE SAME

[75] Inventor: Hideyuki Kondo, Tokyo, Japan

[73] Assignee: NEC Corporation, Tokyo, Japan

[21] Appl. No.: 287,653

[22] Filed: Dec. 21, 1988

Related U.S. Application Data

[63] Continuation of Ser. No. 630,114, Jul. 12, 1984, abandoned.

[30] Foreign Application Priority Data

Jul. 12, 1983 [JP] Japan .................................. 58-126714

[51] Int. Cl.$^4$ .......................................... H01L 27/02
[52] U.S. Cl. ........................................ 357/51; 357/54; 357/59
[58] Field of Search .................... 357/23.6, 51, 71 S, 357/59, 54

[56] References Cited

U.S. PATENT DOCUMENTS

| | | | |
|---|---|---|---|
| 4,329,706 | 5/1982 | Cowder et al. | 357/59 |
| 4,335,505 | 6/1982 | Shibata | 357/54 |
| 4,360,900 | 11/1982 | Bate | 357/54 |
| 4,377,029 | 3/1983 | Ozawa | 357/51 |
| 4,403,394 | 12/1980 | Shepard et al. | 357/23.6 |
| 4,441,246 | 4/1984 | Redwine | 357/41 |
| 4,451,841 | 5/1984 | Hori et al. | 357/23.6 |
| 4,466,177 | 8/1984 | Chao | 437/60 |
| 4,489,338 | 12/1984 | Vonchen | 357/23.6 |
| 4,492,973 | 1/1985 | Ogura | 357/23.6 |
| 4,638,460 | 1/1987 | Matsumoto | 357/23.6 |

FOREIGN PATENT DOCUMENTS

| | | | |
|---|---|---|---|
| 54-30785 | 3/1979 | Japan | 357/23.6 |
| 0011665 | 1/1984 | Japan | 357/23.6 |

OTHER PUBLICATIONS

IEEE Transactions on Electron Devices, Oct. 1976 by Sodini et al, pp. 1187–1189.

*Primary Examiner*—Andrew J. James
*Assistant Examiner*—Mark Prenty
*Attorney, Agent, or Firm*—Burns, Doane, Swecker & Mathis

[57] ABSTRACT

The semiconductor device provided with a MIS capacitor in which an oxidation-resist film to be used for forming a field oxide film partly buried in a semiconductor by means of the selective oxidation technique is employed as a dielectric. A peripheral edge portion of the oxidation-resist film is turned up at a bird's-beak-shaped edge portion of the field oxide film, so that a gap space is produced between the peripheral edge portion of the oxidation-resist film and the bird's-beak-shaped edge portion of the field oxide film. An insulator layer is formed at the peripheral edge portion of the oxidation-resist film. An upper conductor layer of the MIS capacitor provided on the oxidation-resist film is elongated on this insulator layer.

3 Claims, 5 Drawing Sheets

SEMICONDUCTOR INTEGRATED CIRCUIT DEVICE PROVIDED WITH A CAPACITOR ELEMENT HAVING AN OXIDATION-RESIST FILM AS A DIELECTRIC AND PROCESS FOR MANUFACTURING THE SAME

This application is a continuation of Application Ser. No. 630,114, filed July 12, 1984 and now abandoned.

BACKGROUND OF THE INVENTION

1. Field of the Invention

The present invention relates to a semiconductor integrated circuit device, and more particularly to a capacitor element provided within a semiconductor integrated circuit device.

2. Description of the Prior Art

A semiconductor integrated circuit device often contains some capacitor elements. The so-called "p-n junction capacitor" and "MIS (Metal-Insulator-Semiconductor) capacitor" are employed as such capacitor elements. The p-n junction capacitor utilizes the depletion layer (space charge region) extending from a p-n junction between P and N type semiconductor regions. The MIS capacitor includes an insulator film as a dielectric formed on a semiconductor which serves as a lower electrode, and an upper electrode formed on the insulator film. The MIS capacitor is more advantageous in less parasitic effect and a large capacitance per unit area, as compared with the p-n junction capacitor.

In recent years, the semiconductor integrated circuit device has utilized the selective oxidation technique, whereby a large number of circuit elements are isolated from one another by means of a thick field oxide film formed by the selective oxidation technique. According to the selective oxidation technique, the surface of a semiconductor substrate is selectively oxidized by making use of an oxidation-resist film as a mask to produce a thick field oxide film partly buried in the substrate. A nitride of a semiconductor (for instance, a silicon nitride film) is widely employed as such oxidation-resist film. The relative dielectric constant of the silicon nitride film is about 7, and that of the silicon oxide film is about 3.6. That is, the silicon nitride film has a dielectric constant that is about twice as large as that of the silicon oxide film.

Thus, the MIS capacitor employing the silicon nitride film as a dielectric has a relatively large capacitance. Accordingly, the oxidation-resist film used for the selective oxidation is selectively left, and a MIS capacitor element is formed by making use of this left oxidation-resist film as a dielectric.

However, as is well known, an edge portion of the field oxide film produced by the selective oxidation is formed in a shape of a bird's beak (hence the edge portion being called "bird's beak"), and due to a strain generated during the oxidation process, an edge portion of the oxidation-resist film turns up. As a result, the oxidation-resist film is separated from the field oxide film, and a part of the substrate may be exposed. Consequently, a conductor layer formed on the oxidation-resist film as an upper electrode of the MIS capacitor contacts with the exposed part of the substrate at the periphery of the oxidation-resist film. Since the substrate portion under the oxidation-resist film acts as a lower electrode of the MIS capacitor, the above-mentioned contact between the conductor layer and the part of the substrate causes a short circuit between the upper and lower electrodes of the MIS capacitor, so that the structure no more operates as a capacitor element. It has been proposed to form a very thin oxide film of a semiconductor between the oxidation-resist film and the substrate to enhance the adhesion therebetween. Even by such measure, the thin oxide film cracks, so that the upper electrode contact with the substrate. Even if the short circuit does not occur, the withstand voltage of the capacitor element is greatly lowered.

SUMMARY OF THE INVENTION

One object of the present invention is to provide a semiconductor integrated circuit device provided with an improved MIS capacitor element having an oxidation-resist film as a dielectric.

Another object of the present invention is to provide a semiconductor integrated circuit device provided with a MIS capacitor in which an upper electrode is prevented from being contacted with a semiconductor layer serving as a lower electrode.

Still another object of the present invention is to provide a process for manufacturing a semiconductor integrated circuit device provided with a highly reliable capacitor element.

According to one aspect of the present invention, there is provided a semiconductor integrated circuit device comprising a semiconductor region, a field oxide film having a portion buried in one portion of this semiconductor region and having an edge portion gradually thinned in thickness, an oxidation-resist film terminating at the edge portion of the field oxide film and extending on another portion of the semiconductor region adjacent to the above-mentioned one portion, an insulator film covering the edge portion of the oxidation-resist film and the edge portion of the field oxide film while exposing a central surface of the oxidation-resist film, and a conductor layer placed on the exposed surface of the oxidation-resist film and extended over the insulator layer.

According to another aspect of the present invention, there is provided a process for manufacturing a semiconductor integrated circuit device, comprising the steps of selectively formed an oxidation-resist film on a semiconductor layer directly or by the intermediary of an oxide film, selectively oxidizing the semiconductor layer by making use of the oxidation-proof film as a mask to form a field oxide film which is partly buried in the semiconductor layer and has its edge portion laid under a peripheral edge portion of the oxidation-proof film, forming an insulator film which exposes a central surface of the oxidation-proof film and covers the peripheral edge portion and its outer periphery of the oxidation-proof film, and forming a conductor layer provided on the oxidation-proof film and extended over the insulator film.

According to the present invention, a gap between the peripheral edge portion of the oxidation-proof film and the edge portion of the field oxide film generated by the selective oxidation is covered by the insulator film, and an upper electrode conductor layer of a MIS capacitor element passes over the insulator film. Therefore, the conductor layer is prevented from entering into the gap space between the peripheral edge portion of the oxidation-proof film and the edge portion of the field oxide film, so that the degradation of the withstand voltage and the short-circuiting between upper and lower electrodes of the MIS capacitor are prevented.

BRIEF DESCRIPTION OF THE DRAWINGS

The above-mentioned and other objects, features and advantages of the present invention will become more apparent by the following description of the invention taken in conjunction with the accompanying drawings, wherein.

DETAILED DESCRIPTION OF THE INVENTION

Figure 1:
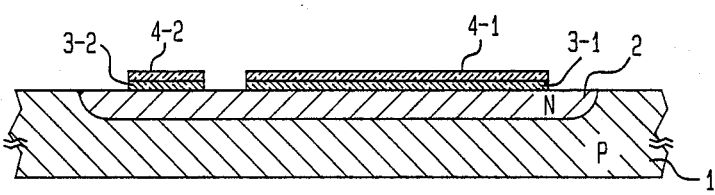
FIGS. 1 through 6 are schematic cross-sectional views showing successive steps in a process for manufacturing a semiconductor integrated circuit device according to one preferred embodiment of the present invention.

Now one preferred embodiment of the present invention will be described in the sequence of the manufacturing steps with reference to FIGS. 1 through 6. The illustrated embodiment shows a MIS capacitor element formed in an integrated circuit device. As shown in FIG. 1, a large number of circuit elements such as bipolar transistors and/or insulated gate transistors, and resistors (not shown) are formed in a P-type silicon substrate 1 having the resistivity of 10 to 20 $\Omega$-cm, in a portion of which an N-type region 2 (surface impurity concentration: $5 \times 10^{18}$ cm$^{-3}$) is formed. The region 2 serves as a lower electrode of the MIS capacitor element. Subsequently, a silicon oxide film of about 500 Å in thickness is formed on the substrate 1, and a silicon nitride film of about 1000 Å in thickness serving as an oxidation-resist film is formed on the oxide film. These silicon oxide and silicon nitride films are removed at the portions corresponding to field regions, but left at the portions corresponding to active regions. In FIG. 1, the oxide film 3-1 and nitride film 4-1 are left to operate as a dielectric of the MIS capacitor, and the oxide film 3-2 and nitride film 4-2 are left to cover a lead-out portion of the lower electrode.

Figure 2:
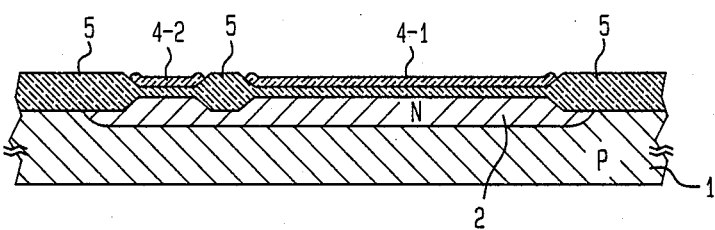
Figure 7:
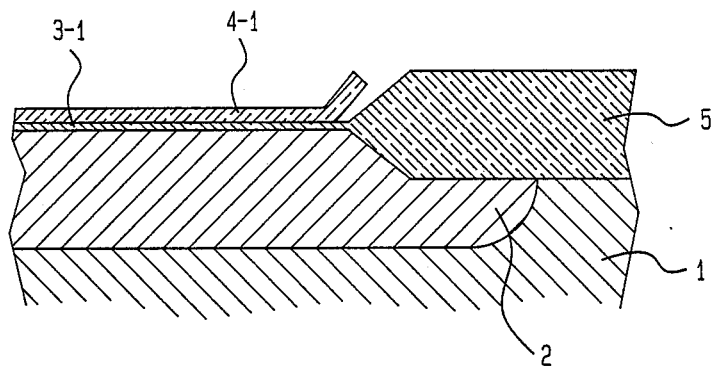
FIG. 7 is an enlarged cross-sectional view of a part of FIG. 2.

As shown in FIG. 2, the substrate 1 is oxidized at about 1000° C for a several hours by employing the silicon nitride films 4-1 and 4-2 as a mask to form a field oxide film 5 of 0.5 to 1.0 $\mu$m in thickness. The field oxide film 5 has a portion buried in the substrate 1. As seen from FIG. 2 and also as well known, the edge portions of the field oxide film 5 take a bird's beak shape. Due to strain caused by the growth of the oxide film 5, the silicon nitride film 4 is turned up at its edge portions to separate the edges of the nitride film 4 from the field oxide film 5, as shown in FIG. 7. FIG. 7 is the enlarged cross-sectional view of FIG. 2.

Figure 8:
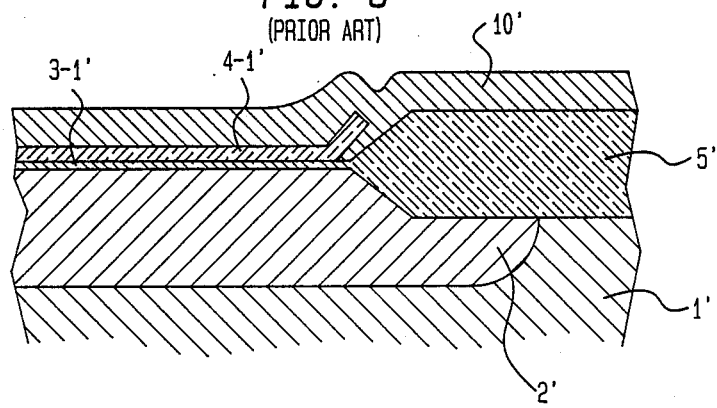
FIG. 8 is a partial cross-sectional view of a semiconductor device in the prior art.

In the prior art, the silicon oxide film 3-2 and the silicon nitride film 4-2 covering the lead-out portion of the lower electrode are removed, and thereafter a metal such as aluminium or the like is vapor-deposited to form an upper electrode positioned on the silicon nitride film 4-1 serving as a dielectric and an lead-out electrode making contact with the region 2. For this reason, as shown in FIG. 8, aluminium forming the upper electrode 10' enters the gap space between the nitride film 4-1' and the field oxide film 5' to make contact with the very thin oxide film 3-1'. Consequently, a withstand voltage of the MIS capacitor element is be degraded, or the aluminium penetrates through the oxide film 3' to make contact with the region 2', resulting in short-circuiting between the upper and lower electrodes.

Figure 3:
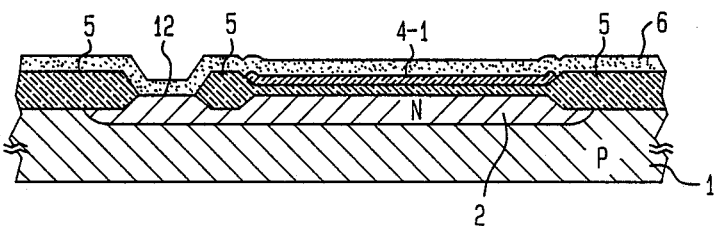
Figure 4:
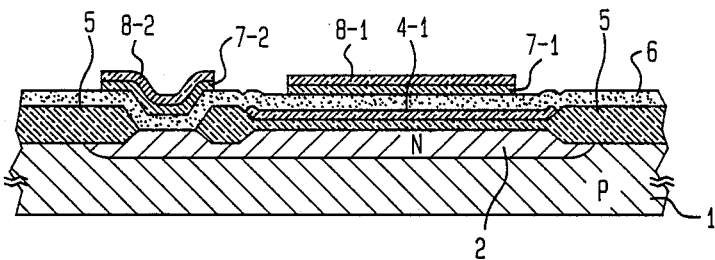

In order to eliminate such shortcomings, according to the present invention, the oxide film 3-2 and the nitride film 4-2 at the lead-out portion for the lower electrode are removed to form a contact hole 12, while the oxide film 3-1 and the nitride film 4-1 serving as a dielectric of the MIS capacitor element are retained, and a polycrystalline silicon layer 6 of about 0.5 $\mu$m in thickness is formed over the entire surface, as shown in FIG. 3.

Figure 9:
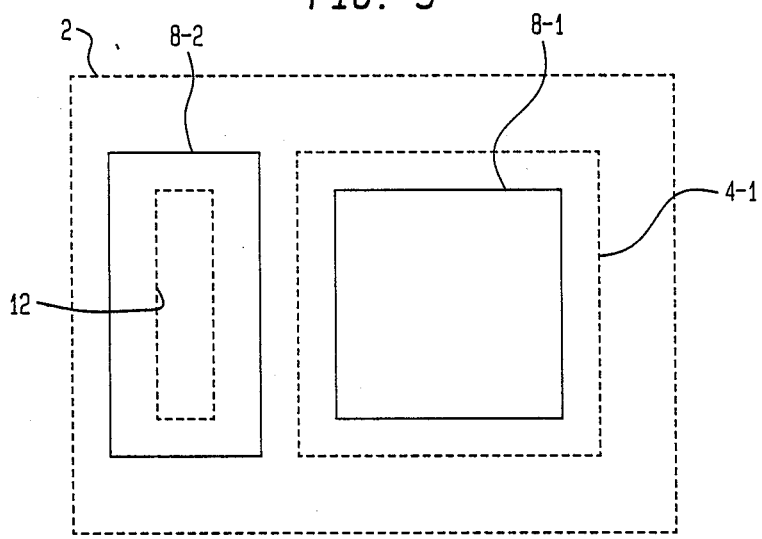
FIG. 9 is an enlarged plan view of a part of FIG. 4.

Thereafter, a silicon oxide film of about 500 Å in thickness and a silicon nitride film of about 1000 Å in thickness are formed on the layer 6, and by selectively removing these silicon oxide film and silicon nitride film, a silicon oxide film 7-1 and a silicon nitride film 8-1 are then formed to be positioned on the dielectric film 4-1. A silicon oxide film 7-2 and a silicon nitride film 8-2 covering the lead-out portion for the lower electrode are also formed. As shown in FIG. 9, the silicon nitride film 8-1 should not cover the portion of the polycrystalline silicon layer 6 positioned over the bird's beak portion of the field oxide film 5 and the edge portion of the dielectric nitride film 4-1.

Figure 5:
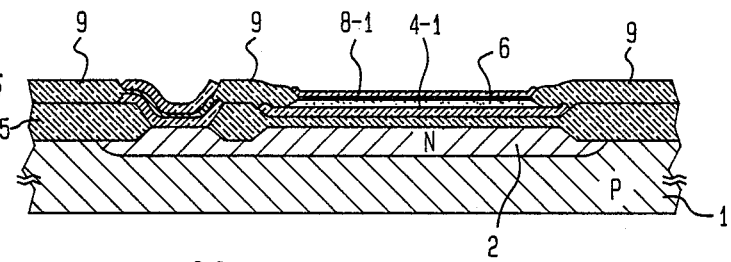
Figure 10:
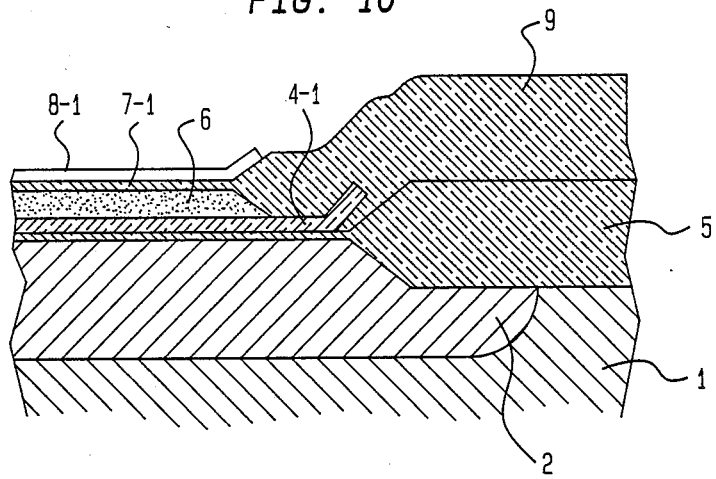
FIG. 10 is an enlarged cross-sectional view of a part of FIG. 5.

As shown in FIG. 5, the polycrystalline silicon layer 6 is oxidized at about 1000° C for a several hours by making use of the nitride films 8-1 and 8-2 as a mask, and thereby the portion of the polycrystalline silicon layer 6 not covered by the nitride films 8-1 and 8-2 is converted into a silicon oxide film 9. As a result, as shown in FIG. 10 which is an enlarged cross-sectional view of a part of FIG. 5, the polycrystalline silicon entered into the gap space between the field oxide film 5 and the silicon nitride film 4-1 is converted into the silicon oxide film 9.

After or before the silicon nitride films 8-1 and 8-2 and the silicon oxide films 7-1 and 7-2 are removed, P-type impurities such as boron are introduced into the polycrystalline silicon layer 6. At this moment, if the impurity introduction step is carried out after removal of the silicon nitride films 8-1 and 8-2 and the silicon oxide films 7-1 and 7-2, the impurities are introduced into the polycrystalline silicon layer 6 by diffusion or ion-implantation. If the step is performed before the removal, the impurities are introduced by an ion-plantation process. The impurity doped layer 6-1 operates as a upper electrode of the MIS capacitor. Thereafter, aluminium is vapor-deposited over the entire surface up to a thickness of about 1.0 $\mu$m, and by selectively removing the deposited aluminium, an upper lead-out electrode 10 and a lower lead-out electrode 11 are formed. The electrode 10 is connected to the impurity doped layer 6-1, and the electrode 11 is connected to the N-type region 2 through the impurity doped layer 6-2.

Owing to the selective oxidizing step for the polycrystalline silicon layer 6 shown in FIG. 5, the gap space between the dielectric nitride film 4-1 and the bird's beak portion of the field oxide film 5 is filled with the silicon oxide film 9 as shown in 10. Accordingly, the upper electrode 10 makes contact neither with the thin oxide film 3-1 nor with the N-type region 2. That is, there is provided a highly reliable MIS capacitor in which degradation of a withstand voltage and short-circuiting between electrodes are prevented.

Figure 6:
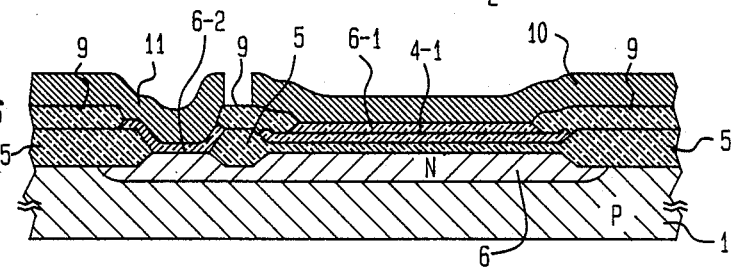

In the step shown in FIG. 6, metal-silicide layers such as platinum silicide may be formed between electrodes 10 and 11 and the polycrystalline silicon layers 6-1 and 6-2. In the step shown in FIG. 3, the polycrystalline silicon layer 6 may be doped with impurities in its growth step. After the silicon nitride film 4-2 and the silicon oxide film 3-2 are removed to form the contact hole 12, an insulating film such as, for instance, a silicon oxide can be formed so as to cover the peripheral portion of the dielectric nitride film 4-1 and, if necessary, on the field oxide film 5. The upper electrode 10 is formed on the dielectric film 4-1 and elongated on the insulating film. In this case, the polycrystalline silicon layer 6 becomes unnecessary.

Figure 11:
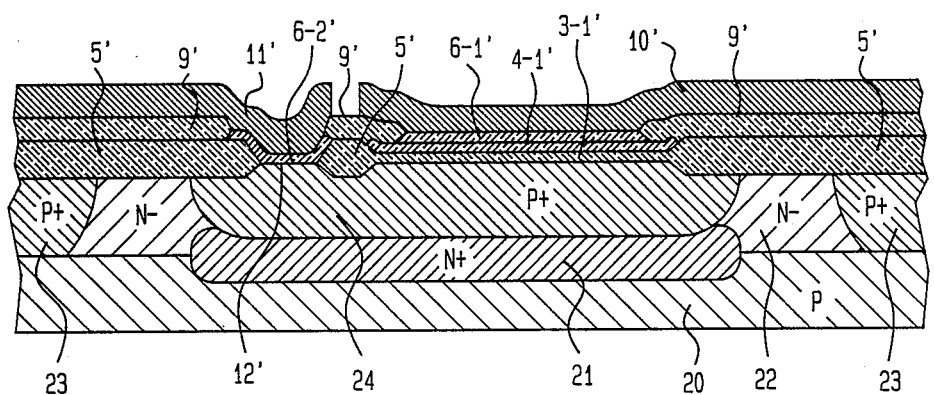
FIG. 11 is a cross-sectional view showing another preferred embodiment of the present invention.

Another preferred embodiment of the present invention is shown in FIG. 11. This embodiment shows a bipolar integrated circuit device in which electrical insulation among circuit elements is effected by p-n junction. In this figure, component parts having the same functions as those shown in FIGS. 1 to 6 are given like reference numerals as primed. Now, description will be made on the successive steps of the manufacturing process of the same device. A P-type silicon substrate 20 is prepared, and an N+-type buried region 21 is formed in the substrate 20 at a MIS capacitor element forming position, simultaneously with the diffusion of N-type impurities for the purpose of reducing a collector series resistance of a bipolar transistor. This region 21 is provided in order to isolate a lower electrode of the MIS capacitor element from the substrate 20. An N-type epitaxial layer 22 having a relatively low concentration is formed on the substrate 20 having the region 21 by means of the vapor growth technique. By introducing P-type impurities from the surface of the layer 22 through the diffusion process or the ion-implantation process, a P+-type isolation region 23 reaching the substrate 20 is formed to divide the layer 22 into a plurality of island regions. Simultaneously with the formation of the region 23, a lower electrode region 24 of a MIS capacitor element is formed. The region 24 cannot make contact with the substrate 20 due to the existance of the N+-type buried region 21. In other words, the lower electrode of the MIS capacitor is isolated from the substrate 20. The region 24 may be formed simultaneously with formation of a base region of an NPN transistor. In this case, the N+-type buried region 21 is unnecessary. However, the base region has a relatively high sheet resistance, and hence the resistance of the lower electrode of the MIS capacitor is increased. Therefore, it is favorable to form the lower electrode region 24 simultaneously with the formation of the isolation region 23 having a small sheet resistance.

After the above-mentioned steps, the device is manufactured through the same steps as those shown in FIGS. 1 to 6. More particularly, oxidation-resist layers including a dielectric nitride film 4-1' are formed on the layer 22 via an oxide film 3-1', and a field oxide film 5' is formed by making use of the oxidation-resist layers as a mask. After a contact hole 12' for lead-out of a lower electrode is formed, a polycrystalline silicon layer 6' is formed, and then selectively converted into an oxide film 9' by means of the selective oxidation technique. As described previously, the oxide film 9' fills the gap space between the peripheral portion of the dielectric nitride film 4-1' and the bird's beak portion of the field oxide film 5'. Finally, an upper lead-out electrode 10' and a lower lead-out electrode 11' are formed.

Accordingly, the MIS capacitor shown in FIG. 9 has a large capacitance per unit area and a small electrode lead-out resistance, and further has a structure suitable for a bipolar integrated circuit device. As a matter of course, the shortcomings such as degradation of a withstand voltage and the short-circuiting between electrodes are eliminated. However, the lower electrode region 24 of the MIS capacitor is formed simultaneously with the formation of the P+-type isolation region 23, and therefore, this MIS capacitor is inferior in a small element area and a small parasitic capacitance.

Figure 12:
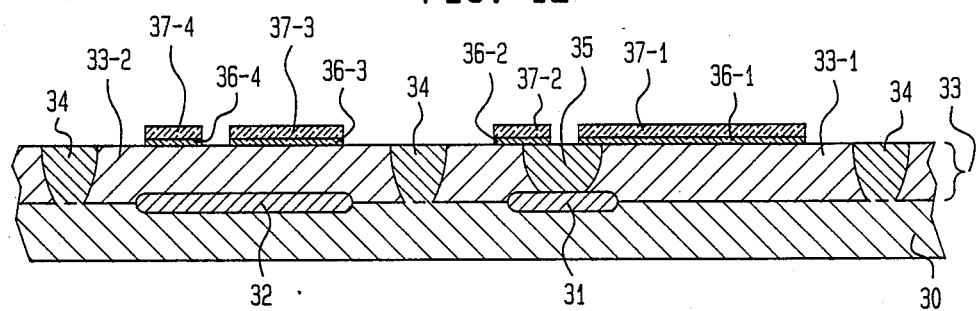
FIG. 12 through 18 are schematic cross-sectional views showing successive steps in a process for manufacturing a semiconductor integrated circuit device according to still another preferred embodiment of the present invention.

FIGS. 12 to 18 shows the producing steps of still another embodiment which has an improved structure to realize a small element area and a small parasitic capacitance. In this embodiment, besides a MIS capacitor element, a bipolar transistor is also provided. As shown in FIG. 12, by selectively diffusing N-type impurities such as phosphorus, arsenic, etc. into a P-type silicon substrate 30 having the resistivity of 10 to 20 Ω-cm, N+-type buried regions 31 and 32 having the surface impurity concentration of $5 \times 10^{18}$ cm$^{-3}$ are formed. The region 31 is provided for isolating a lower electrode of the MIS capacitor element from the substrate 30, and the buried region 32 is formed for reducing a collector series resistance of the transistor. Formed on the substrate 30 having the buried regions 31 and 32 is an N-type epitaxial layer 33 of about 5 μm in thickness having the resistivity of 1 Ω-cm by the vapor-growth process. A P+-type isolation region 34 having the sheet resistance of about 40 Ω /□ is formed so as to reach the substrate 30 by selectively diffusing P-type impurities such as boron from the surface of the layer 33, so that the layer 33 is isolated into a plurality of island regions. FIG. 12 shows two island regions 33-1 and 33-2. Simultaneously with the formation of the isolation region 34, a lower electrode region 35 of the MIS capacitor is formed. On the epitaxial layer 33 are formed a silicon oxide film 36 of about 500 Å in thickness and a silicon nitride film 37 of about 1000 Å in thickness serving as an oxidation-resist layer, and they are selectively removed. In FIG. 12, a nitride film portion 37-1 serving as a dielectric and a nitride film portion 37-2 at a lower electrode lead-out portion in the MIS capacitor, and a nitride film portion 37-3 at a base region forming portion and a nitride film portion 37-4 at a collector electrode lead-out portion in the transistor, are retained. As will be apparent from FIG. 12, the region 35 is not formed over the entire area of the MIS capacitor in distinction from the device shown in FIG. 11, but is partially formed so as to extend from a part of the dielectric film forming portion to a part of the electrode lead-out portion.

Figure 13:
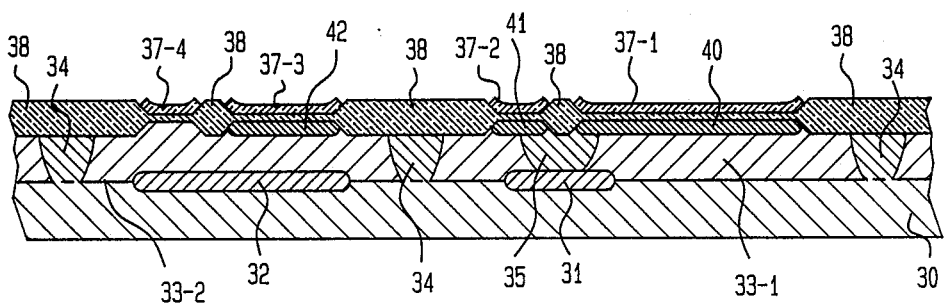

The layer 33 is oxidized at about 1000° C for a several hours by making use of the retained nitride films 37-1 to 37-4 as a mask, so that a field oxide film 38 of 0.5 to 1.0 μm in thickness is formed as shown in FIG. 13. The oxide film 38 is partly buried in the layer 33. At this moment, as mentioned in FIG. 7, a peripheral edge portion of the dielectric nitride film 37-1 turns up to produce a gap space between the peripheral edge portion and a bird's beak portion of the field oxide film 38. Thereafter, the nitride film 37-4 at the collector electrode lead-out portion in the transistor is covered by a photo-resist (not shown), and boron impurities are ion-implanted at a dose of $1 \times 10^{14}$ cm$^{-2}$ with an acceleration energy of 80 KeV. After the photo-resist is removed, annealing for activating the ion-implanted impurities is performed. As a result, a P-type lower electrode region 40 is formed under the dielectric nitride film 37-1 in the MIS capacitor element. Also, under the nitride film 37-2 is formed a P-type lower electrode lead-out region 41, and a P-type base region 42 is formed under the film 37-3. These P-type regions 40, 41 and 42 have the surface impurity concentration of about $1 \times 10^{17}$ cm$^{-3}$ and the junction depth of about 0.8 $\mu$m. The P-type regions 40 and 41 are connected with each other via the P$^+$-type region 35. In other words, the lower electrode region of the MIS capacitor is constructed by three P-type regions 35, 40 and 41. The regions 40 and 41 have a shallow junction depth, and hence the lateral extention of impurities for the regions 40 and 41 is small. Therefore, the distances between the regions 40 and 41 and the isolation region 34 can be narrowed. That is, the element area in this embodiment is made small as compared to the MIS capacitor element shown in FIG. 11. Furthermore, the junction area between the P$^+$-type region 35 and the N$^+$-type buried region 31 becomes small, and therefore, a parasitic capacitance can be reduced.

Figure 14:
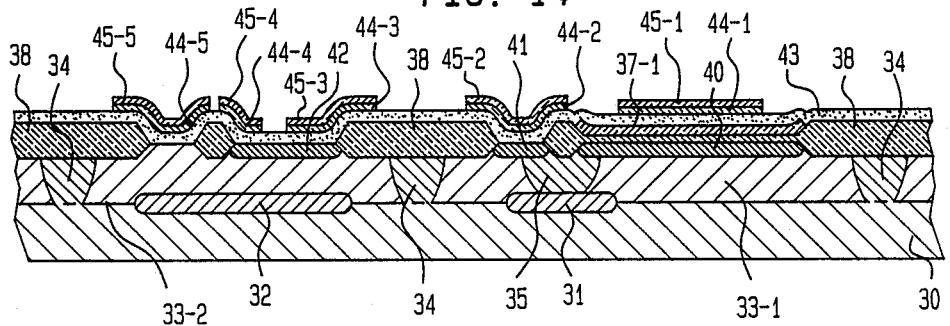

After the nitride films 37-2 to 37-4 and the oxide films 36-2 to 36-4 except for the dielectric nitride film 37-1 and oxide film 36-1 are removed, a polycrystalline silicon layer 43 not doped with impurities is formed over the entire surface up to a thickness of about 0.5 $\mu$m by a vapor-growth process, as shown in FIG. 14. A silicon oxide film 44 of about 500 Å in thickness and a silicon nitride film 45 of about 1000 Å in thickness are formed on the layer 43, and then selectively removed. FIG. 14 illustrates five nitride film patterns 45-1 to 45-5. The nitride films 45-1 and 45-2 are retained for the purpose of producing an upper electrode and a lower lead-out electrode of the MIS capacitor. Accordingly, as shown in FIG. 9, both of the nitride films 45-1 and 45-2 should not cover the portion of the polycrystalline silicon layer 43 that is present over the peripheral edge portion of the dielectric nitride film 37-1 and the bird's beak portion of the field oxide film 38. The nitride film 45-3 is retained for the purpose of forming an emitter region and an emitter electrode, and the nitride film 45-4 is retained for the purpose of forming a base contact region and a base electrode. The nitride film 45-5 is retained for the purpose of forming a collector contact region and a collector electrode.

Figure 15:
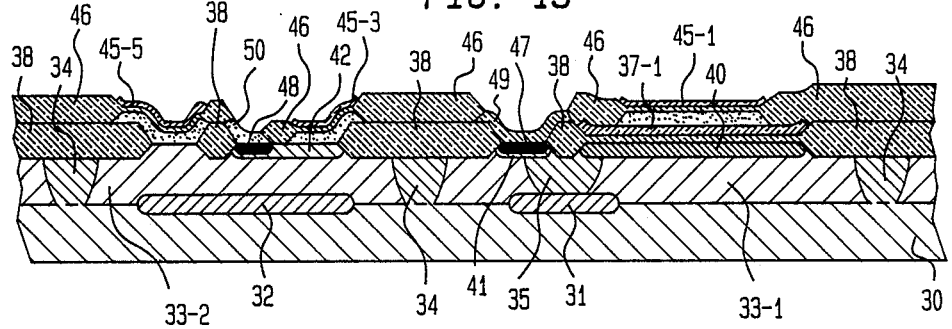

As shown in FIG. 15, the polycrystalline silicon layer 43 is oxidized at about 1000° C for a several hours by making use of the nitride films 45-1 to 45-5 as a mask, so that the exposed portion of the polycrystalline silicon layer 43 is converted into a silicon oxide film 46. Consequently, the gap space between the peripheral edge portion of the dielectric nitride film 37-1 and the bird's beak portion of the field oxide film 38 is filled with the silicon oxide film 46, and further, an upper electrode and a lower lead-out electrode in a MIS capacitor as well as emitter, base and collector electrode patterns in a transistor, are respectively formed. By selectively covering with a photo-resist (not shown), the nitride films 45-2 and 45-4 and the oxide films 44-2 and 44-4 are removed, and thereafter, boron impurities is diffused. The boron impurities diffuse into monocrystalline silicon through the exposed polycrystalline silicon, so that as shown in FIG. 15, a lower electrode contact region 47 having the junction depth of 0.4 to 0.8 $\mu$m and the surface impurity concentration of about $5 \times 10^{-18}$cm$-3$ and a lower lead-out electrode 49 are formed. At the same time, a base contact region 48 and a base electrode 50 are formed. The electrodes 49 and 50 are made of P-type polycrystalline silicon.

Figure 16:
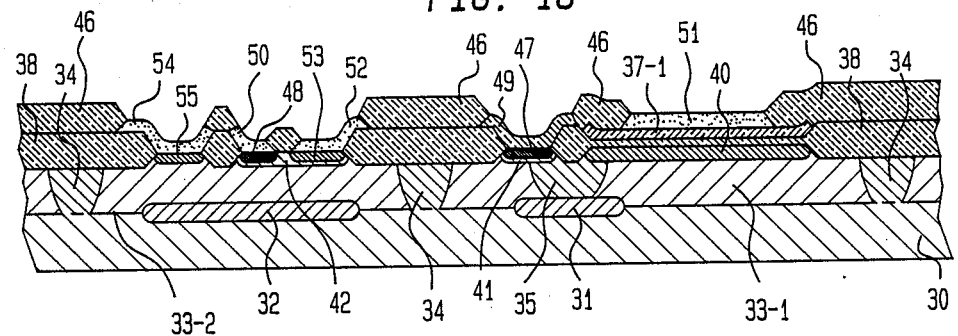

The remaining nitride films 45-1, 45-3 and 45-5 and oxide films 44-1, 44-3 and 44-5 are removed, and the electrodes 49 and 50 are covered by a photo-resist (not shown). Thereafter, phosporus (N-type) impurities are diffused into the exposed polycrystalline silicon layer. As a result, an upper electrode 51 of the MIS capacitor made of N-type polycrystalline silicon is formed as shown in FIG. 16. Owing to the dielectric nitride film 37-1, the N-type impurities are not diffused into the lower electrode region 40. By the diffusion of the phosphorus impurities, an N-type emitter region 53 and N-type collector contact region 55 having the depth of 0.2 ~ 0.3 $\mu$m and the surface impurity concentration of about $1 \times 10^{19}$ cm$^{-3}$ are formed, and further an emitter electrode 52 and a collector electrode 54 are formed.

Figure 17:
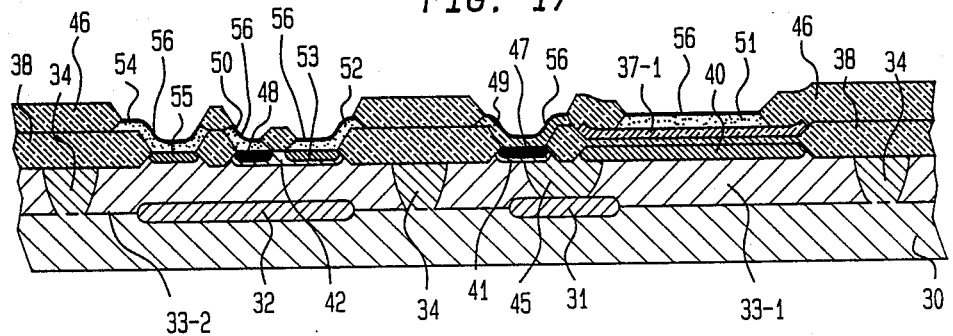

Silicon oxide films on the respective polycrystalline electrodes formed by the diffusion of impurities or the like are removed, and thereafter platinum is vapor-deposited on the polycrystalline silicon electrodes. As shown in FIG. 17, platinum silicide layers 56 are formed on the respective polycrystalline silicon electrodes by the thermal treatment, and thereby resistances of the electrodes are sufficiently lowered.

Figure 18:
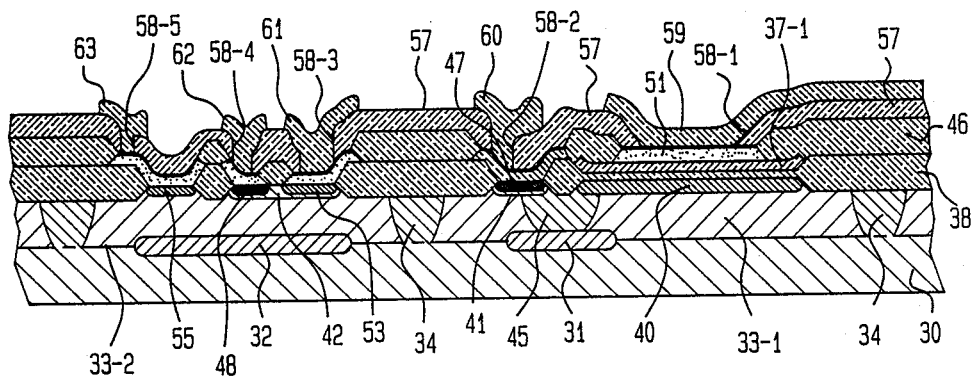

As shown in FIG. 18, a silicon oxide film 57 of about 0.5 $\mu$m in thickness is formed over the entire surface by the vapor-growth process, and contact holes 58-1 to 58-5 are then formed by selectively removing the silicon oxide film 57. Aluminium is vapor-deposited up to a thickness of about 1 $\mu$m so as to cover the silicon oxide film 57 and to fill the contact holes 58-1 to 58-5, and the patterning is then performed. As a result, wiring layers 59 and 60 for the upper and lower electrodes 51 and 49 in the MIS capacitor element as well as wiring layers 61, 62 and 63 for the base, emitter and collector electrodes 50, 52 and 54 in the transistor, are respectively formed.

The gap space between the peripheral edge portion of the dielectric nitride film 37-1 and the bird's beak portion of the field oxide film 38 is filled with the silicon oxide film 46, and further, the silicon oxide film 57 is formed on the silicon oxide film 46. Accordingly, the contact between the wiring layer 59 and the region 40 is surely prevented, and thus there is provided a highly reliable MIS capacitor.

In FIGS. 11 to 18, the lower electrodes 24 (FIG. 11) and 35, 40 and 41 (FIG. 13) in the MIS capacitor may be replaced by N$^+$-type regions formed by diffusing N-type impurities such as phosphorus into the epitaxial regions 22 and 33-1 at a high concentration. In such a modified case, the N -type regions do not be formed over the entire width of the epitaxial regions 22 and 33-1. In the example shown in FIG. 11, the N$^+$-type region can be formed simultaneously with formation of the emitter region. Also, the N$^+$-type buried regions 21 and 31 can be omitted.

As described in detail above, according to the present invention, a problem inherent to a MIS capacitor in which the oxidation-resist film to be used in the selective oxidation technique is employed as a dielectric film, is resolved, so that a highly reliable MIS capacitor is provided.

The materials, sizes, conductivity types or manufacturing conditions of the respective component members exemplified in the above-described embodiments are not critical, but may be changed by those skilled in the art. For instance, the conductivity types of the respective region can be inverted, and the semiconductor material is not limited to silicon. In addition, a film of metal oxide such as aluminium oxide or the like may be used for the oxidation-resist film. Furthermore, the silicon oxide films 3-1, 3-1' and 36-1 under the dielectric nitride films 4-1, 4-1' and 37-1 may be omitted.

What is claimed is:

1. A semiconductor device comprising a semiconductor substrate, an oxide layer formed on said semiconductor substrate, said oxide layer including a first portion of a flat surface, a second portion continuous with said first portion to surround said first portion and having an increasing thickness and a third portion having a thickness larger than said first portion and being continuous with said second portion and partially embedded in the surface of said semiconductor substrate, an oxidation-resist film formed on said oxide layer and having a central portion located on said first portion of said oxide layer and peripheral edge portions all located and terminated on said second portion of said oxide layer, a first conductive layer formed on said central portion of said oxidation-resist film, all peripheral edges of said first conductive layer being located and terminated on said central portion of said oxidation-resist film and separated from all the peripheral edge portions of said oxidation-resist film, an insulating layer formed on said second and third portions of said oxide layer and extended on said central portion of said oxidation-resist film to cover all the peripheral edge portions of said oxidation-resist film, said insulating layer being in contact with the peripheral edges of said first conductive layer and free of substantial contact with an upper surface of said first conductive layer to surround said first conductive layer and to expose a whole of the upper surface of said first conductive layer, and a second conductive layer formed on the upper surface of said first conductive layer and in contact with edges of the upper surface of said first conductive layer and elongated over said insulating layer, wherein said insulating layer intervenes between said second conductive layer and said peripheral edge portions of said oxidation-resist film and wherein said first conductive layer, said first portion of said oxide layer and said central portion of said oxidation-resist film, and said semiconductor substrate constitute a capacitor and operate as a first electrode, a dielectric film, and a second electrode of said capacitor, respectively.

2. The device as claimed in claim 1, wherein said first conductive layer is made of a polycrystalline semiconductor, and said second conductive layer is made of a metal.

3. The device as claimed in claim 2, further comprising an alloy of a metal and a semiconductor formed between said first and second conductive layers.

* * * * *